(12) United States Patent
Hodges et al.

(10) Patent No.: US 12,308,586 B2
(45) Date of Patent: May 20, 2025

(54) ELECTRONIC PROTOTYPING INTEROPERABILITY

(71) Applicant: Microsoft Technology Licensing, LLC, Redmond, WA (US)

(72) Inventors: Stephen Edward Hodges, Cambridge (GB); Michal J. Moskal, Seattle, WA (US); Gabriele D'Amone, Cambridge (GB); James Alexander Devine, Cambridge (GB); Jonathan Paul De Halleux, Seattle, WA (US); Thomas Jaudon Ball, Mercer Island, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 419 days.

(21) Appl. No.: 17/852,726

(22) Filed: Jun. 29, 2022

(65) Prior Publication Data

US 2024/0006833 A1 Jan. 4, 2024

(51) Int. Cl.
*H01R 31/06* (2006.01)
*H01R 12/52* (2011.01)
*H05K 1/11* (2006.01)

(52) U.S. Cl.
CPC .......... *H01R 31/06* (2013.01); *H01R 12/523* (2013.01); *H01R 31/065* (2013.01); *H05K 1/117* (2013.01); *H05K 2201/09027* (2013.01)

(58) Field of Classification Search
None
See application file for complete search history.

(56) References Cited

U.S. PATENT DOCUMENTS

| 8,488,332 B2 * | 7/2013 | Eguchi | H05K 1/117 |
| | | | 361/748 |
| 8,708,323 B2 | 4/2014 | Hoyt | |
| 10,535,938 B2 * | 1/2020 | Sherman | H01R 13/50 |

(Continued)

FOREIGN PATENT DOCUMENTS

RU 2631122 C1 9/2017

OTHER PUBLICATIONS

Ex Parte Quayle Action mailed on Jun. 17, 2024, in U.S. Appl. No. 17/849,305, 07 pages.

(Continued)

*Primary Examiner* — Tho D Ta
(74) *Attorney, Agent, or Firm* — Rainier Patents, P.S.

(57) ABSTRACT

The description relates to prototyping systems, including hubs for electrically connecting devices. One example can include an electrically insulative substrate and at least two connector tabs defined by the substrate. Each connector tab can include a data contact a power contact and a ground contact positioned on the substrate. A data bus can be positioned relative to the substrate and electrically connect all of the data contacts, a power bus can be positioned relative to the substrate and electrically connect all of the power contacts and a ground bus can be positioned relative to the substrate and electrically connect all of the ground contacts in accordance with a first prototyping format. The example can also include adapter contacts positioned on the substrate and configured to electrically connect to a data contact, a power contact, and a ground contact of another device that complies with a second different prototyping format.

20 Claims, 7 Drawing Sheets

(56) References Cited

U.S. PATENT DOCUMENTS

| | | | |
|---|---|---|---|
| 10,603,750 | B1 | 3/2020 | Taylor |
| 2013/0102937 | A1 | 4/2013 | Ehrenreich |
| 2017/0194721 | A1 | 7/2017 | Fan |
| 2018/0126175 | A1 | 5/2018 | Seitz |
| 2020/0052450 | A1 | 2/2020 | Sugiyama |
| 2020/0300598 | A1 | 9/2020 | Kim |
| 2020/0335432 | A1 | 10/2020 | Murtagian |
| 2021/0037684 | A1 | 2/2021 | Kwak |
| 2021/0270431 | A1 | 9/2021 | John |
| 2022/0200212 | A1* | 6/2022 | Yi .................. G06F 1/1658 |
| 2022/0260805 | A1 | 8/2022 | Ready |
| 2023/0389175 | A1 | 11/2023 | Hodges |
| 2024/0008174 | A1 | 1/2024 | Hodges |

OTHER PUBLICATIONS

Notice of Allowance mailed on Aug. 9, 2024, in U.S. Appl. No. 17/849,305, 10 pages.

"25 Pairs 3.0MM Bullet Banana Plug Male & Female Connectors RC Model Parts for ESC Motor Lipo Battery Gold-plated", Retrieved from: https://www.amazon.co.uk/gp/product/B094N5FF2T/ref=ppx_yo_dt_b_asin_image_o07_s00?th=1, May 11, 2021, 2 Pages.

"Copper Alloy Push Pins with Compression Springs", Retrieved from: https://web.archive.org/web/20201031175434/ http://www.rego.com.tw/product_detail.php?prdt_id=247, Oct. 31, 2020, 2 Pages.

"Nacdac", Retrieved from: https://web.archive.org/web/20220317005444/https://microsoft.github.io/jacdac-docs/, Mar. 17, 2022, 8 Pages.

Lambrichts, et al., "A Survey and Taxonomy of Electronics Toolkits for Interactive and Ubiquitous Device Prototyping", In Proceedings of the ACM on Interactive, Mobile, Wearable and Ubiquitous Technologies, vol. 5, Issue 2, Jun. 2021, 24 Pages.

Non-Final Office Action mailed on Sep. 5, 2024, in U.S. Appl. No. 17/852,698, 18 pages.

Notice of Allowance mailed on Sep. 4, 2024, in U.S. Appl. No. 17/849,305, 8 pages.

Final Office Action mailed on Nov. 21, 2024, in U.S. Appl. No. 17/852,698, 19 pages.

Notice of Allowance mailed on Nov. 4, 2024, in U.S. Appl. No. 17/849,305, 8 pages.

U.S. Appl. No. 17/852,698, filed Jun. 29, 2022.

U.S. Appl. No. 17/849,305 filed Jun. 24, 2022.

Notice of Allowance mailed on Apr. 7, 2025, in U.S. Appl. No. 17/852,698, 12 pages.

* cited by examiner

ELECTRONIC PROTOTYPING INTEROPERABILITY

BACKGROUND

In the electronic device realm, many ideas may be tested before a successful solution is identified. Electronic prototyping platforms or formats are designed to support quick exploration and iteration of the numerous ideas. However, some ideas may be tested on one prototyping platform and other ideas may be tested on a different prototyping platform.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the figure and associated discussion where the reference number is first introduced. Where space permits, elements and their associated reference numbers are both shown on the drawing page for the reader's convenience. Otherwise, only the reference numbers are shown.

DESCRIPTION

The present concepts relate to modular electronics prototyping formats or platforms. Electronics prototyping platforms are designed to support quick exploration and iteration of ideas, typically resulting in an artefact that runs on the bench to demonstrate aspects of the operation of a device configuration. However, the user may desire to create one functionality using a first prototyping platform and another functionality using a second prototyping platform. Traditionally, lack of interoperability between the two prototyping platforms prevented combining the functionalities. The present concepts offer a technical solution to these and/or other technical problems.

FIGS. 1A-1E collectively show an example system 100A that enables cross-platform circuitry between a first prototyping platform 102(1) and a second prototyping platform 102(2). In this case, the first prototyping platform can be manifest as the Jacdac brand prototyping platform and the second prototyping platform can be manifest as the micro:bit brand prototyping platform. In light of the explanation provided above and below, the skilled artisan should recognize other applicable prototyping platforms. An example circuit 104 is shown relative to the first prototyping platform 102(1). The circuit 104 can include multiple devices 106 that are electrically connected by cables 108.

Figure 1A:
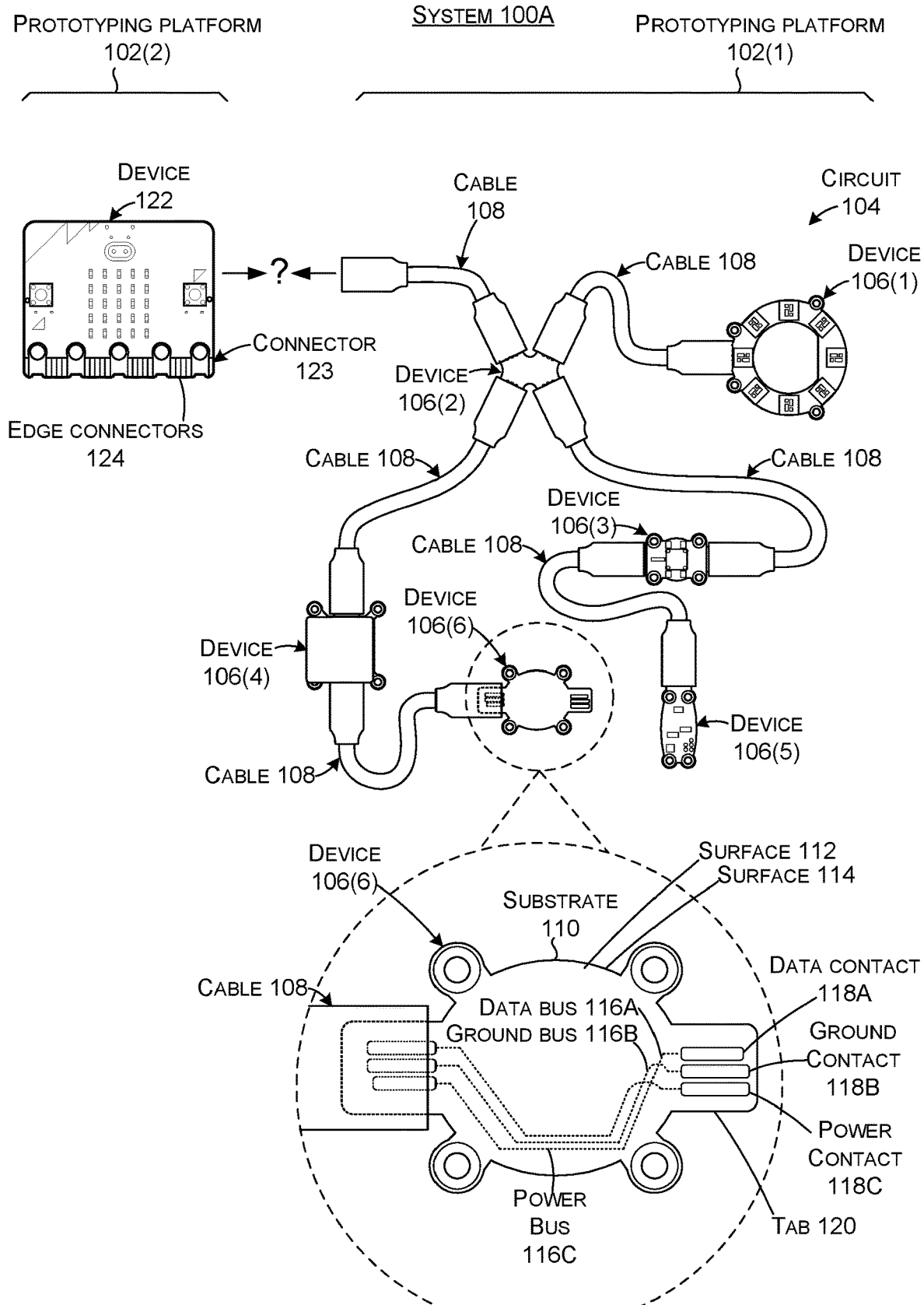
FIGS. 1A-1E, 2A, 2B, 3, and 4 show elevational views of example systems in accordance with some implementations of the present concepts.

Details of the devices 106 are shown in the enlarged view of device 106(6) in FIG. 1A. In this example, devices 106 include a substrate 110. The substrate 110 can entail an electrically insulative material, such as polymer or a composite, among others. In some cases, the substrate 110 can be generally planar and define opposing first and second major surfaces 112 (facing the reader) and 114 (facing away from the reader and as such not readily visible). The devices 106 can also include a data bus 116A, a ground bus 116B, and a power bus 116C positioned on or in the substrate 110. For instance, the buses 116 can entail electrical traces or lines formed between layers of the substrate. The devices 106 can also include data contacts 118A, ground contacts 118B, and power contacts 118C that can be exposed on the surface of the substrate and electrically connected to the respective buses 116. In this configuration, the device only includes one data bus and all data contacts are connected to the data bus. Similarly, the device only includes one ground bus and all ground contacts are connected to the ground bus and the device only includes one power bus and all power contacts are connected to the power bus.

The contacts 118 can be located on tabs 120. The cables 108 can include contacts and conductors to electrically connect to the contacts 118 on two devices 106 and thereby electrically interconnect the two devices.

System 100A can also include a second prototyping platform 102(2) and representative device 122 that complies with the second prototyping platform. In this case, the first prototyping platform 102(1) can be manifest as the Jacdac brand prototyping platform, among others and the second prototyping platform 102(2) can be manifest as the micro:bit brand prototyping platform, among others.

As shown in FIG. 1A, the user may want to connect circuit 104 to device 122. For instance, the device 122 may be a processor board of the second prototyping platform 102(2) that the user wants to include in the circuit to provide a desired functionality. In this case, the device 122 includes a connector 123 in the form of a single edge connector 124. However, the cables 108 and the contacts 118 on the tabs 120 that are compliant with the first prototyping platform 102(1) are not compatible (e.g., interoperable) with the connector 123 that is compliant with the second prototyping platform 102(2).

Figure 1B:
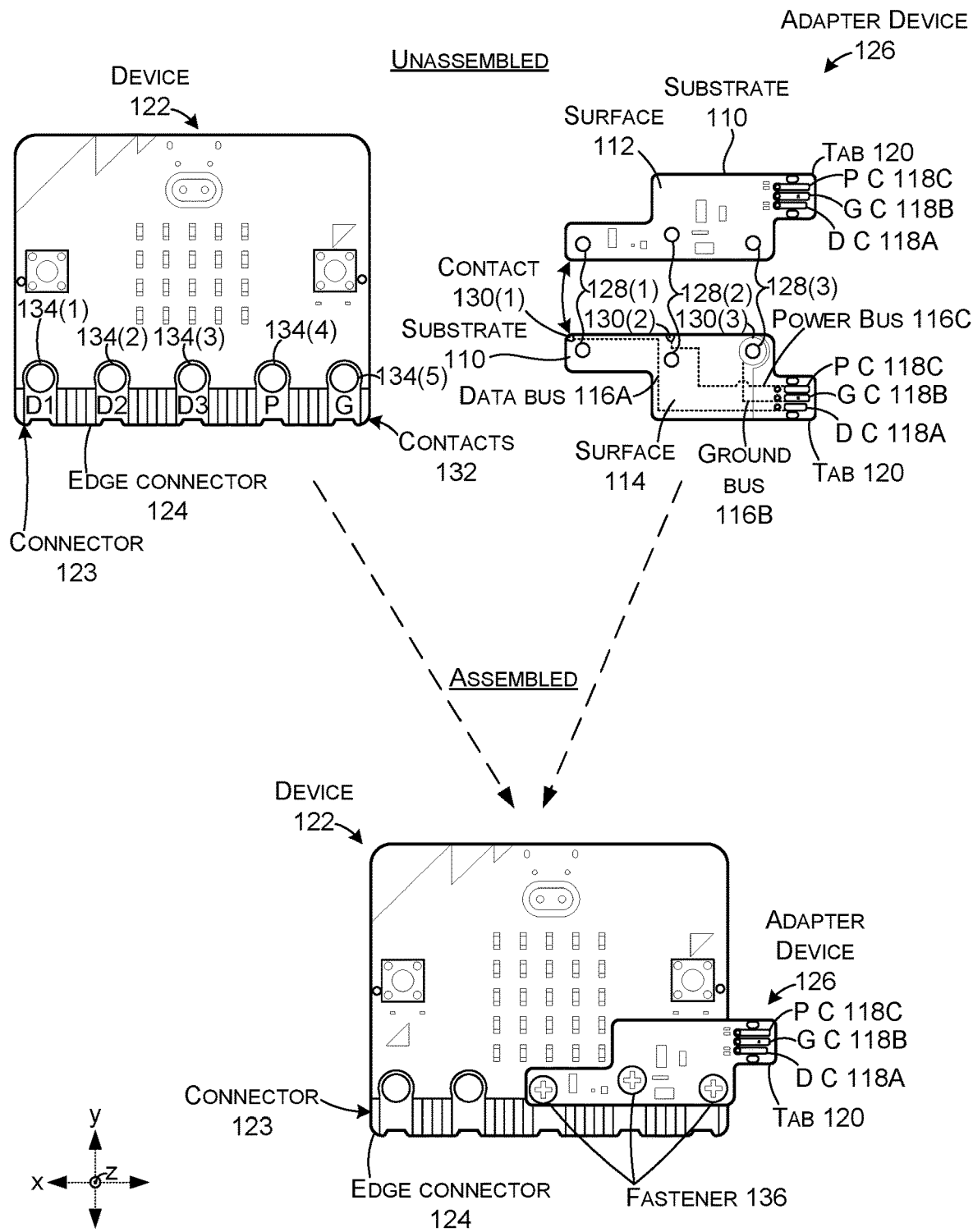

FIG. 1B introduces an adapter device 126 that facilitates interoperability between the first prototyping platform 102(1) and the second prototyping platform 102(2). The adapter device 126, of the first prototyping platform, and the device 122 of the second prototyping platform are shown in FIG. 1B in an "Unassembled" state and an "Assembled" state for purposes of explanation. Note that in this implementation, the adapter device 126 can accomplish this interoperability without occupying (e.g., blocking) the connector 123 (e.g., edge connector 124) of device 122. Thus, the edge connector 124 is still available for use for connecting device 122 to another device of the second prototyping platform 102(2).

In this case, as shown in the unassembled state of FIG. 1B, the adapter device 126 includes substrate 110 that defines tab 120. FIG. 1B shows both sides of the substrate 110 (e.g., with the first surface 112 facing up and with the substrate flipped over and the second surface 114 facing up). Holes 128 can be formed in the substrate 110. This example employs three holes 128. The size and spacing of the holes 128 can be determined based upon properties of the device 122 (e.g., as defined by the second prototyping protocol), which will be described below.

Electrical contacts 130 are positioned on the second surface 114 of the adapter device 126 to contact appropriate contacts on the device 122. Electrical contact 130(1) is positioned proximate to hole 128(1) on the second major surface 114 and electrically connected to data bus 116A. Electrical contact 130(2) is positioned on the second major surface 114 proximate to hole 128(2) and electrically connected to power bus 116C. Another electrical contact 130(3) is positioned around hole 128(3) on the second major surface 114 and electrically connected to ground bus 116B. The electrical contacts 130(1), 130(2), and 130(3) can function as a set of electrical contacts that are arranged to make electrical contact with electrical circuits on the device 122 of the second prototyping platform.

The edge connector 124 of the device 122 includes multiple different electrical contacts 132 that are coupled to distinct data lines of the device (not shown to reduce clutter on the drawing page). The contacts 132 include three data contacts labeled D1, D2, and D3. The contacts 132 also include a power contact (P) and a ground contact (G). The contacts 132 border five mounting holes 134.

The contacts 130 of the adapter device 126 are strategically positioned to contact the corresponding contacts 132 of the edge connector 124 of the device 122 when the second surface 114 of the adapter device 126 is fastened to the device 122. Specifically, in this implementation, hole 128(1) can be secured to hole 134(3), hole 128(2) can be secured to hole 134(4), and hole 128(3) can be secured to hole 134(5). In this case, the securing can be accomplished with fasteners 136 shown in the assembled state of FIG. 1B.

The securing of the adapter device 126 to device 122 can cause electrical contact 130(1) (e.g., the data contact) to electrically connect with the D3 data contact of the edge connector 124. The securing can also cause electrical contact 130(2) (e.g., the power contact) to electrically connect with the power (P) contact of the edge connector 124 and cause electrical contact 130(3) (e.g., the ground contact) to electrically connect with the ground (G) contact of the edge connector 124. Thus, the data bus 116A of adapter device 126 is now electrically coupled to one of the data lines (D3) of device 122, ground bus 116B is now electrically coupled to ground on device 122 and power bus 116C is coupled to power on device 122. Though not shown, circuitry could be employed to manage power to specified values for a given prototyping platform. For instance, voltage could be reduced or boosted as the power enters the prototyping platform to specified values to avoid damage.

Note that the configuration described directly above electrically connects power of the first prototyping platform (e.g., adapter device 126) to power of the second prototyping platform (e.g., device 122). An alternative configuration could eliminate contact 130(2) on the adapter device 126. Thus, power would not be connected and shared across prototyping platforms. Instead, devices on each prototyping platform would provide their own power (e.g., power could be shared among devices of each platform, but not across platforms).

Note that any of the described implementations can provide power conditioning between the two prototyping platforms to provide the intended functionality (e.g., provide power having specified voltage and/or current characteristics) and/or decrease risk of damage/failure, such as damage associated with power surges. This aspect is described in more detail below relative to FIG. 3.

In the assembled state, the adapter device's tab 120 with its data contact 118A, ground contact 118B, and power contact 118C is accessible and can be used in the same manner as the tabs 120 in FIG. 1A. Thus, the adapter device can be connected to other first prototyping platform devices. Similarly, edge connector 124 allows device 122 to be connected to other second prototyping platform devices.

Figure 1C:
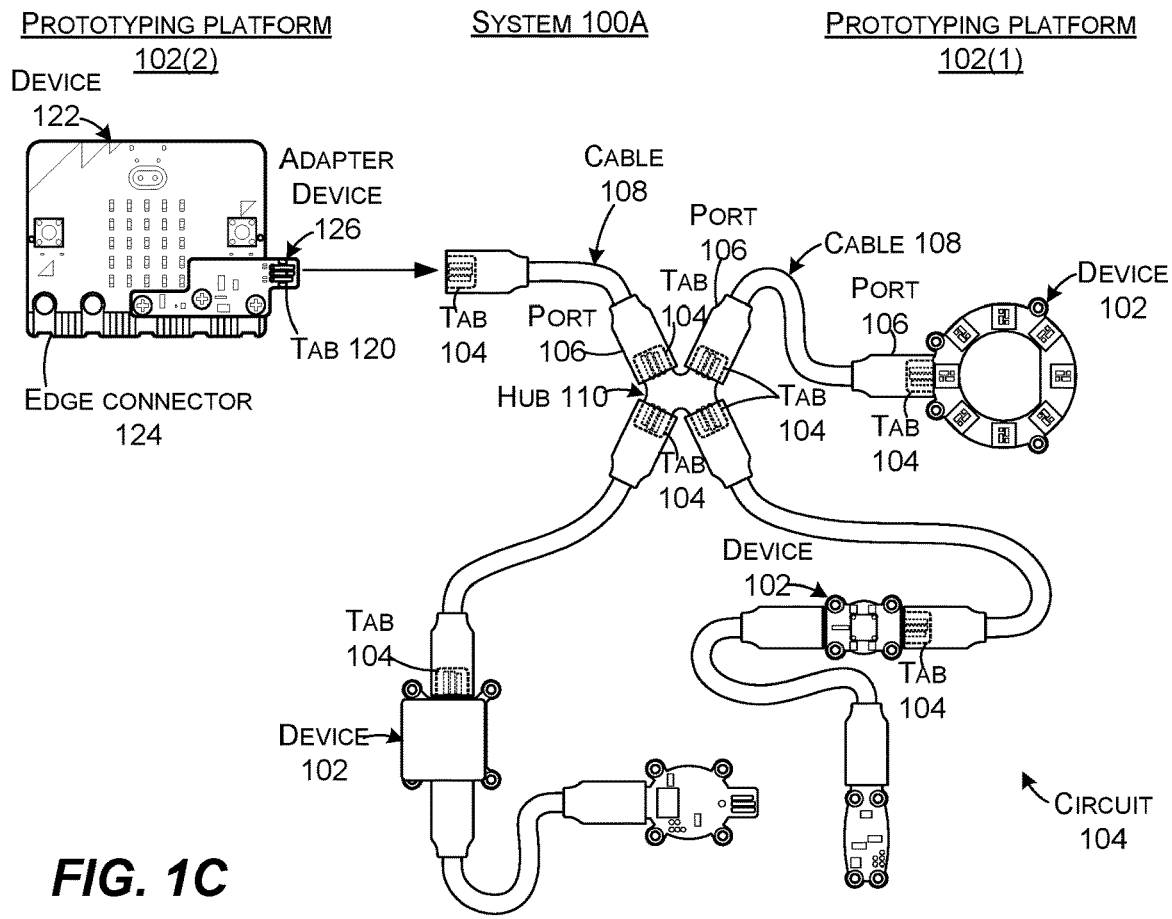
Figure 1D:
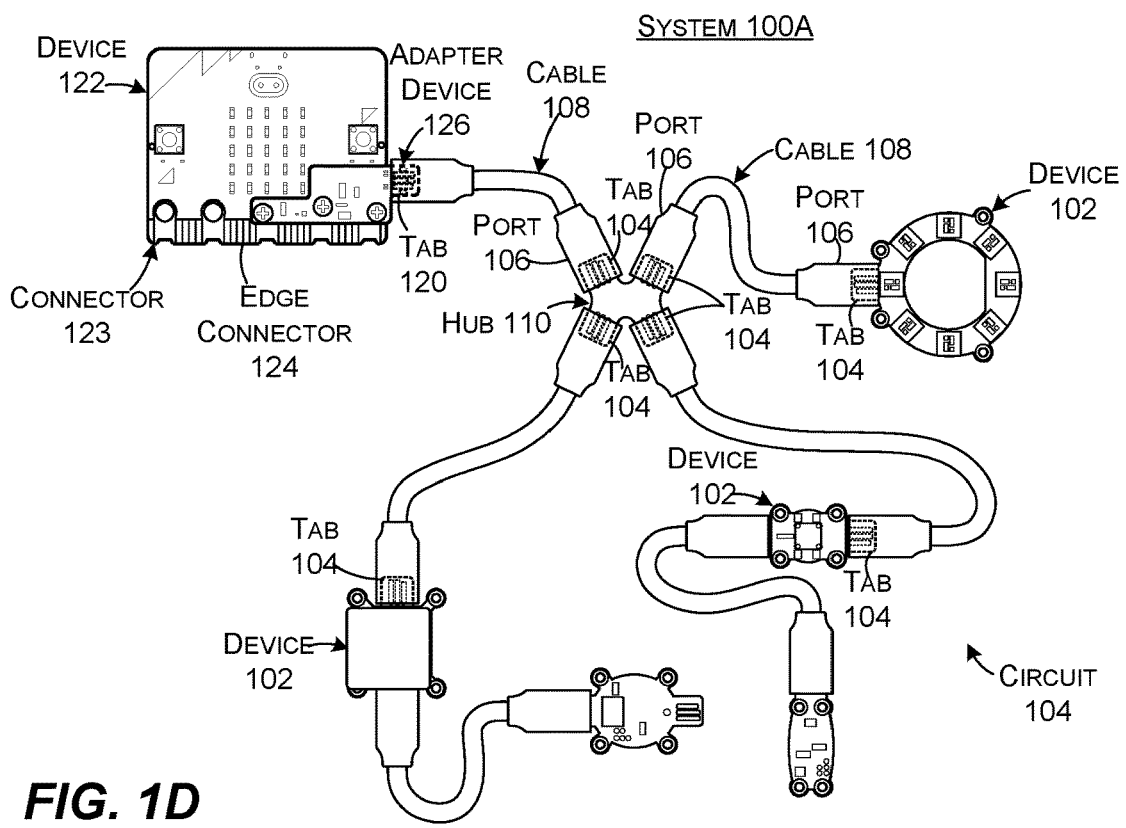

FIG. 1C shows the device 122 assembled with adapter device 126. Adapter device 126 in turn can be added to circuit 104 via tab 120 and a cable 108. FIG. 1D shows tab 120 of adapter device 126 connected to circuit 104 via cable 108. Thus, the adapter device 126 is electrically connected to both the first prototyping platform 102(1) via tab 120 and the second prototyping platform 102(2) via edge connecter 124. This allows data to be communicated between prototyping platforms and enhances the flexibility on each platform. In relation to first prototyping platform 102(1), tab 120 of the adapter device 126 can be identical to other tabs and can be readily connected via a cable without any modifications. In relation to the second prototyping platform, edge connecter 124 remains usable to add additional devices and thus cost and complexity is decreased. Such an example is shown in FIG. 1E.

Figure 1E:
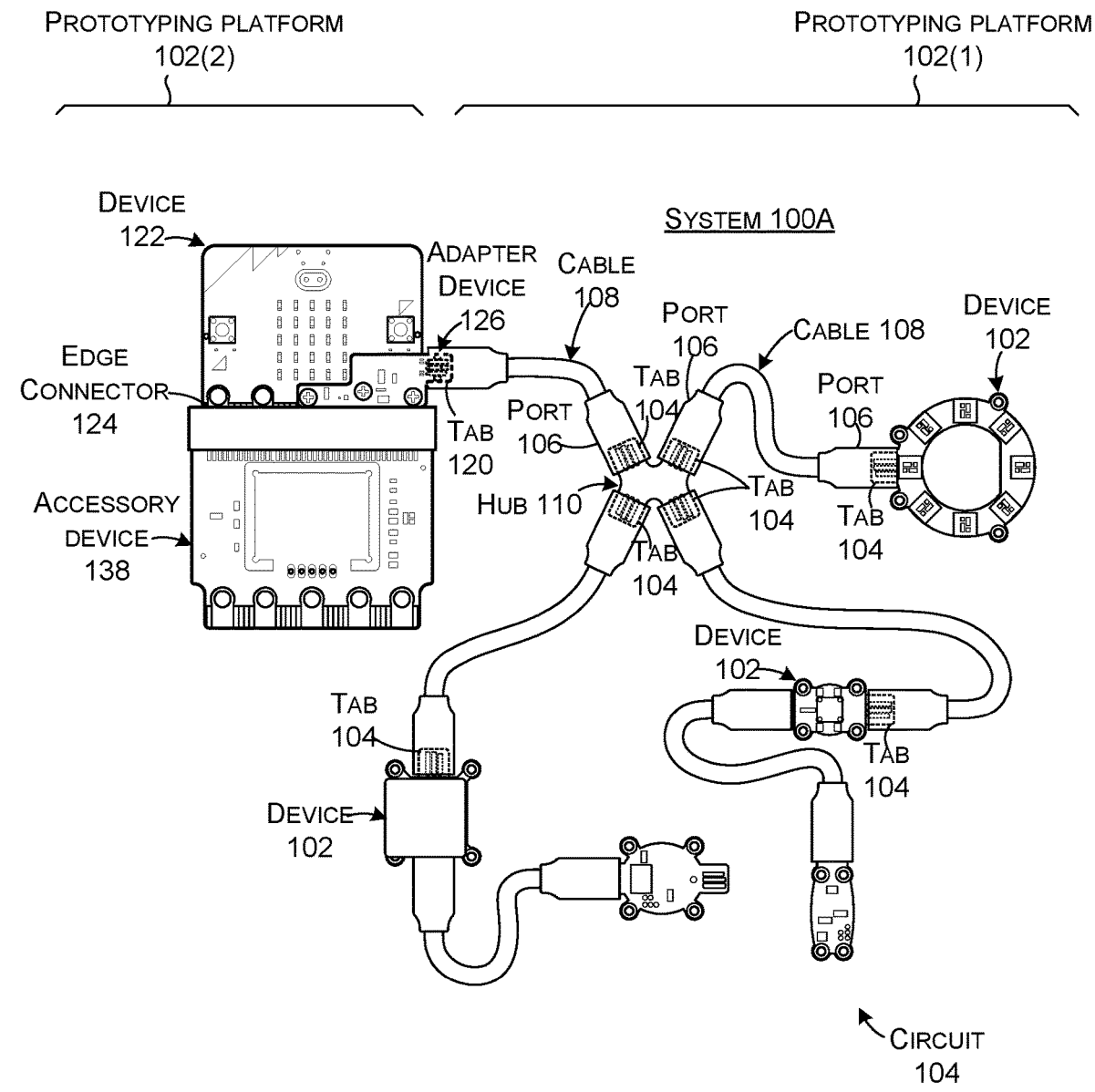

FIG. 1E shows a second prototyping platform accessory device 138 electrically connected to device 122 via edge connector 124. As mentioned above, the present implementations can offer a technical solution of connecting different prototyping platforms via the connector 123 without occupying the connector 123 so it remains free for simultaneously coupling with other devices. The present implementations allow circuit 104 to now include device 122 and accessory device 138 of the second prototyping platform 102(2) and adapter device 126 from first prototyping platform 102(1) in addition to the devices of FIG. 1A to achieve a functionality of interest to the user.

Figure 2A:
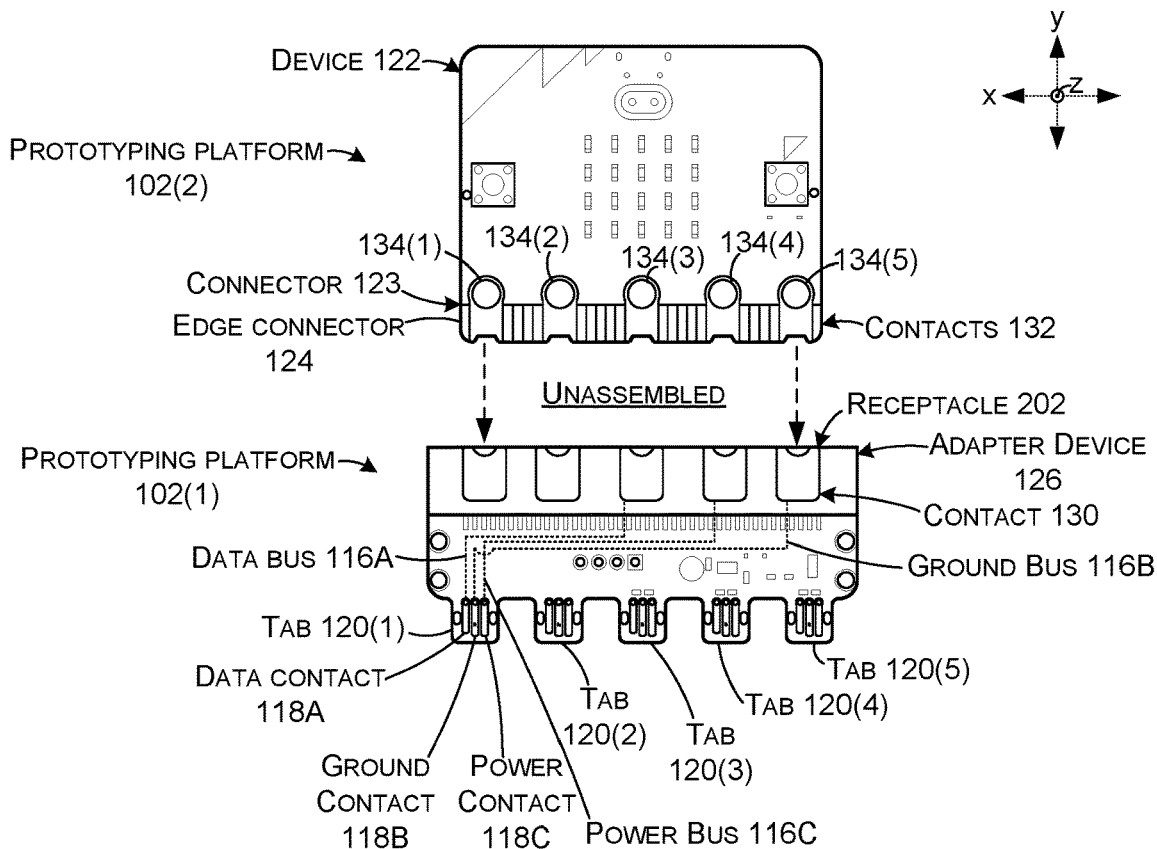
Figure 2B:
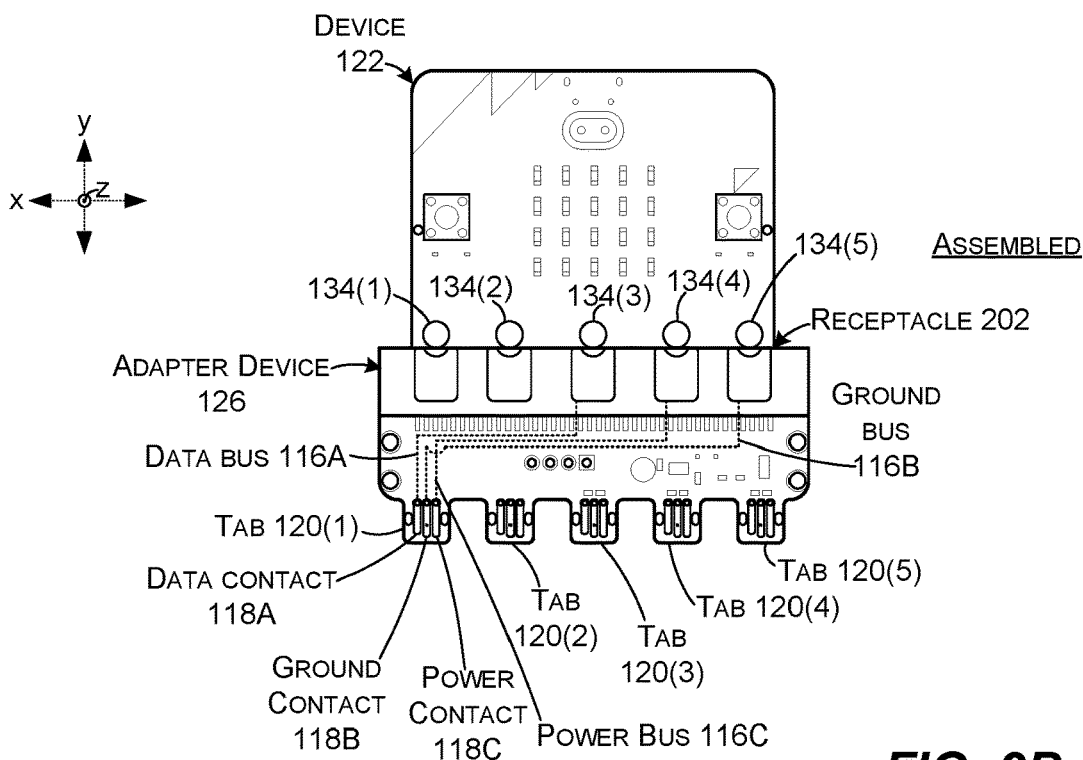

FIGS. 2A and 2B collectively show another example system 100B that enables cross-platform connectivity between a first prototyping platform 102(1) and a second prototyping platform 102(2). System 100B includes several elements that were introduced above relative to system 100A and are not reintroduced here for sake of brevity. In this case, the first prototyping platform can be manifest as the Jacdac brand prototyping platform, among others and the second prototyping platform can be manifest as the micro:bit brand prototyping platform, among others. System 100B includes device 122, which was introduced above relative to FIGS. 1A-1E, and which is consistent with the second prototyping platform 102(2). System 100B also includes example adapter device 126.

In this implementation, as shown in the unassembled state of FIG. 2A adapter device 126 is configured to physically receive the connector 123 (e.g., edge connector 124) of device 122 in a receptacle 202. FIG. 2B shows the device 122 assembled with adapter device 126. The adapter device 126 can provide a technical solution of providing both a contact fit to physically retain the device in the adapter device (e.g., retain them together as an assembly) and electrical connections between contacts of the edge connector 124 and the data bus 116A, ground bus 116B, and power bus 116C, of the adapter device 126. In this case, there is not a one-to-one relationship between the electrical components of the two prototyping platforms 102 (e.g., the first prototyping platform defines one data bus while the second prototyping platform defines multiple different data lines). As such, not all contacts 132 of the edge connector 124 are contacted by the contacts 130 of the adapter device 126. As mentioned above, the illustrated adapter device 126 automatically provides physical retention and electrical connection to the device 122 when the user inserts the edge connector 124 into the adapter device 126 without any additional fasteners or other user action.

Figure 3:
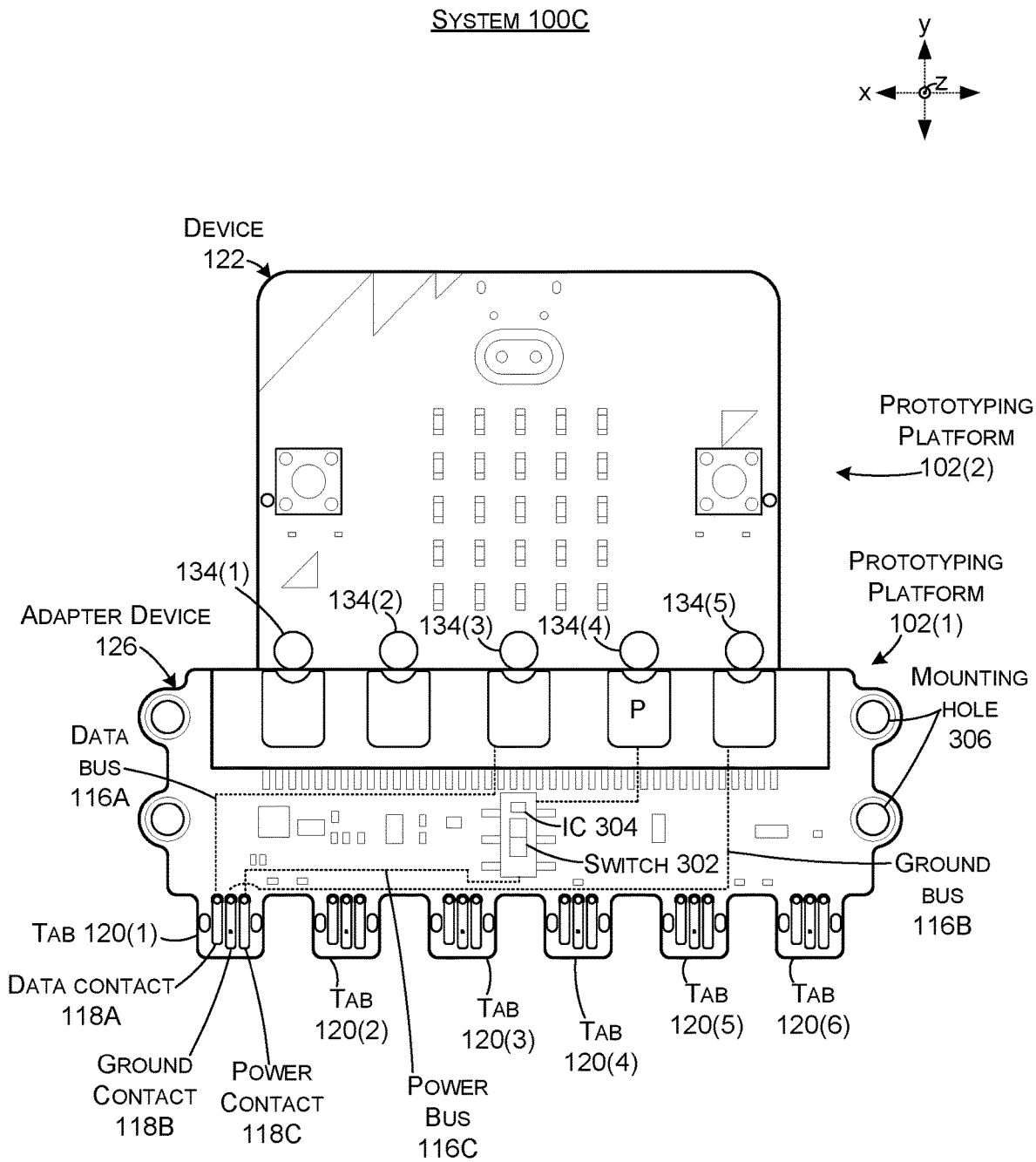

FIG. 3 shows another example system 100C that enables cross-platform circuitry between first prototyping platform 102(1) and second prototyping platform 102(2). System 100C includes several elements that were introduced above relative to systems 100A and 100B and are not reintroduced here for sake of brevity. In this case, the adapter device 126 is configured to electrically and mechanically receive device 122 in a similar manner to that described above relative to FIGS. 2A and 2B. This implementation includes a user-actionable power control switch 302 between the edge connector's power contact (P) (which is obscured in this view by the adapter device 126) and the power bus 116C. The power contact P is proximate to the hole 134(4), which is visible above the adapter device 126. The power control switch 302 is configured to allow the user to decide the direction of power flow between the devices of the two prototyping platforms. For instance, the user can select to have power flow from the first prototyping platform (e.g., from the adapter device 126) to the second prototyping platform (e.g., to device 122) or from the second prototyping platform to the first prototyping platform. Thus, devices of the first prototyping platform can be connected to any of the six tabs 120 to power devices of the first prototyping platform and the second prototyping platform and/or to receive power from the second prototyping platform as selected by the user via power control switch 302.

The power control switch 302 can include, or be associated with, an integrated circuit (IC) 304 (shown in ghost). The IC 304 can provide power conditioning so that the power receiving prototyping platform (dependent on the position of the power control switch 302) receives power that is compliant with the design parameters of that prototyping platform. Note that some implementations can employ the IC 304 without the power control switch 302 to condition power in one or both directions.

The adapter device 126 in some configurations could be connected to a breadboard via tabs 120 to facilitate incorporating more devices of the prototyping platform 102(1). Alternatively, the adapter device could be increased in size in the xy reference plane and fitted with mounting holes 306 that are positioned according to a defined pitch, such as 10 millimeters by 10 millimeters or whole number multipliers of the pitch (e.g., 10 mm×20 mm or 20 mm×20 mm, for instance) to facilitate incorporating (electrically and mechanically) more devices of the first prototyping platform 102(1).

Figure 4:
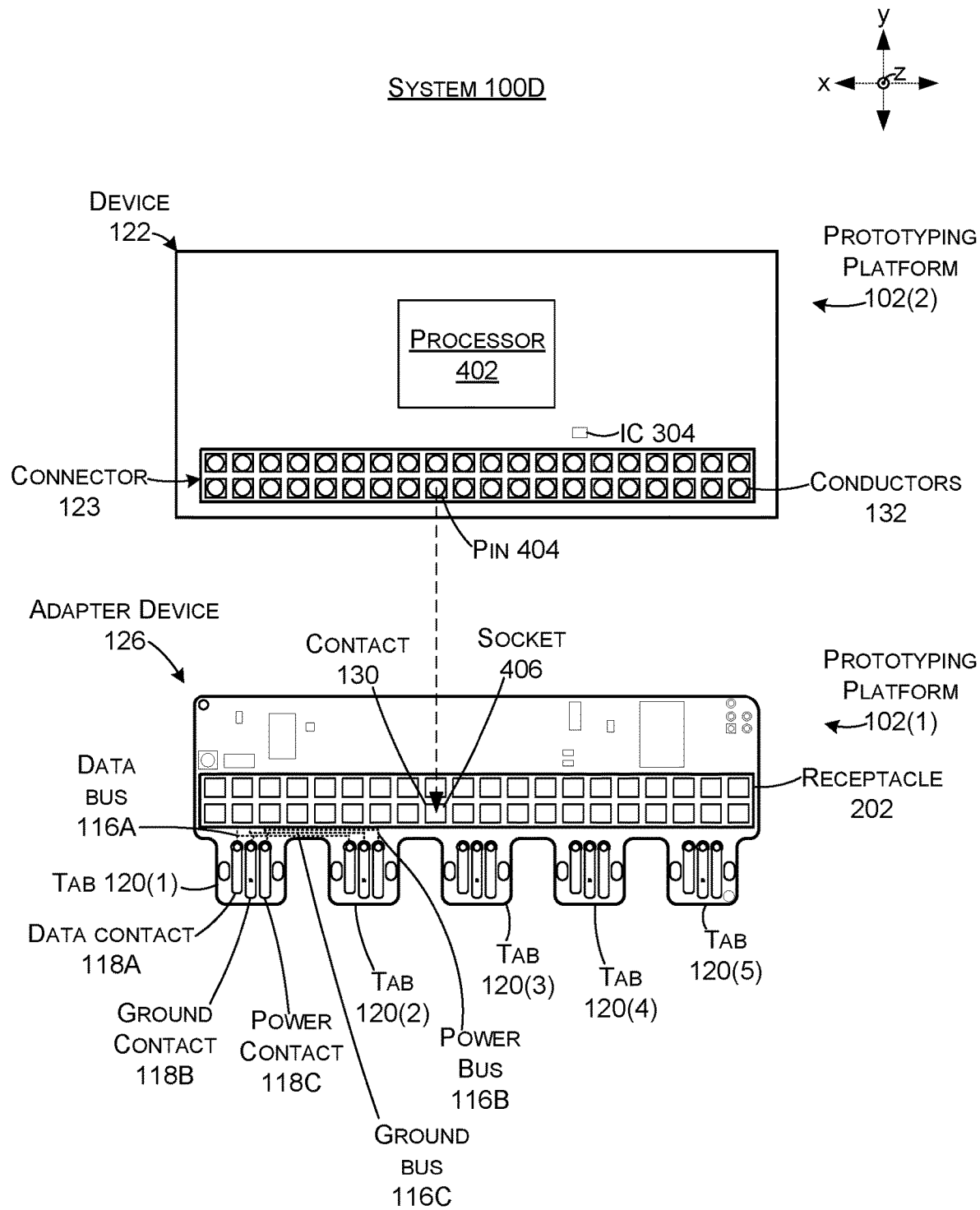

FIG. 4 shows another example system 100D that enables cross-platform connectivity between first prototyping platform 102(1) and second prototyping platform 102(2). System 100D includes several elements that were introduced above relative to systems 100A-100C and are not reintroduced here for sake of brevity. In this case, the first prototyping platform can be manifest as the Jacdac brand prototyping platform, among others and the second prototyping platform can be manifest as the Raspberry Pi brand prototyping platform, among others.

In this implementation, the device 122 includes a processor 402 that is electrically coupled to contacts 132 of connector 123. In this example, the contacts 132 are manifest as pins 404. In this case, the pins 404 are arranged in two rows of 20 each. In order to avoid clutter on the drawing page, only one representative pin 404 is labelled. In this case, the adapter device's receptacle 202 includes two corresponding rows of 20 sockets 406 that include contacts 130. In order to avoid clutter on the drawing page, only one representative socket 406 and contact 130 are labelled.

The sockets 406 are configured to physically receive and hold the pins 404 so that the pins and contacts 130 make an electrical connection. Individual contacts 130 can be electrically connected to the data bus 116A, ground bus 116B, and power bus 116C. (The buses are only partially shown to reduce clutter on the drawing page. The buses are shown and described in detail above.) The buses 116 are in turn electrically connected to the data contacts 118A, ground contacts 118B, and power contacts 118C of the tabs 120. In order to avoid clutter on the drawing page, data contacts 118A, ground contacts 118B, and power contacts 118C are labelled only relative to tab 120(1). Through this configuration, the adapter device 126 provides a technical solution of electrically connecting a single data line, a single ground line, and a single power line between the devices of the two different prototyping platforms.

In this implementation, the processor 402 can provide the power conditioning functionality. Alternatively, dedicated power conditioning circuitry such as IC 304 can be employed to function as a current limiter and/or to provide voltage step-up/step-down, among other power conditioning functions.

The implementations described above offer technical solutions relating to interoperability between prototyping platforms, such as those involving a first prototyping platform that is based on three lines (e.g., a data bus, a ground bus, and a power bus) to other prototyping platforms that specify many distinct lines, such as multiple different data lines. The described adapter devices include one or more connectors tabs that employ a single contact to each of the data bus, ground bus, and power bus. The adapter devices also include contacts that are connected to the three buses and are positioned to make electrical contact with specific lines on devices as specified by the second prototyping protocol. Thus, the adapter devices solve the technical problem of connecting the data bus, ground bus, and power bus of the first prototyping protocol to appropriate corresponding lines of the second prototyping platform. This provides the user with flexibility to generate circuitry that includes interoperating devices of both prototyping protocols.

The adapter devices can be formed from various materials, such as various polymers and/or composites. The adapter devices can be formed utilizing various techniques, such as molding, 3D printing or other additive techniques, and/or machining or other material removal techniques. For instance, the substrate can be a monolithic single layer. The data bus, the ground bus, and the power bus, (or at least portions thereof) can be positioned over the substrate and covered with an insulative layer. Alternatively, the substrate can entail multiple layers and the data bus, the ground bus, and the power bus, (or at least portions thereof) can be positioned between the layers.

Individual elements of the adapter devices can be made from various materials, such as metals, plastics, and/or composites. These materials can be prepared in various ways, such as from formed sheet metals, die cast metals, machined metals, 3D printed materials, molded or 3D printed plastics, and/or molded or 3D printed composites, among others, and/or any combination of these materials and/or preparations can be employed. Conductors (e.g., lines), such as the contacts and/or the buses can be formed/positioned using various formation techniques, such as lithographic techniques, trace deposition techniques (e.g., printing), etc.

Various methods of manufacture, assembly, and/or use for prototyping systems including hubs are contemplated beyond those shown above relative to FIGS. 1A-4.

Although techniques, methods, devices, systems, etc., pertaining to prototyping platforms are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

Various examples are described above. Additional examples are described below. One example includes a system comprising an adapter device having at least one connector tab that comprises a data electrical contact (data contact) connected to a single data bus, a ground electrical contact (ground contact) electrically connected to a single ground bus, and a power electrical contact (power contact) connected to a single power bus according to a first prototyping format and a set of electrical contacts arranged to electrically contact a connector of a second different prototyping format having multiple data lines, the adapter being physically configured to electrically connect the single data bus of the first prototyping format to only one of the multiple data lines of the second different prototyping format, the ground contact of the first prototyping format to a ground line of the second different prototyping format.

Another example can include any of the above and/or below examples where the adapter device is further configured to electrically connect the power contact of the first prototyping format to a power conductor of the second different prototyping format.

Another example can include any of the above and/or below examples where the adapter device is further configured to electrically connect the power contact of the first prototyping format to a power contact of the connector that is electrically connected to the power conductor of the second different prototyping format.

Another example can include any of the above and/or below examples where the connector is part of a processor board that complies with the second different prototyping format.

Another example can include any of the above and/or below examples where the adapter device further comprises a power control switch that is configured to selectively control whether power flows from the adapter device to the processor board or from the processor board to the adapter device.

Another example can include any of the above and/or below examples where the first prototyping format specifies that all data contacts are electrically coupled to the single data bus, all ground contacts are electrically coupled to the single ground bus and all power contacts are electrically coupled to the single power bus.

Another example can include any of the above and/or below examples where the second different prototyping format specifies multiple distinct data conductors that are electrically insulated from one another.

Another example can include any of the above and/or below examples where the adapter device comprises an electrically insulative substrate that defines the connector tab, and wherein the electrical contacts of the first prototyping format are positioned directly on a surface of the electrically insulative substrate at the connector tab.

Another example can include any of the above and/or below examples where the connector is an edge connector.

Another example can include any of the above and/or below examples where the adapter is physically configured to electrically connect the single data bus of the first prototyping format to only one of the multiple data lines of the second different prototyping format, the ground contact of the first prototyping format to the ground line of the second different prototyping format the power contact of the first prototyping format to a power line of the second different prototyping format without blocking the edge connector of the second different prototyping format from being coupled to an accessory of the second different prototyping format.

Another example includes a device comprising an adapter device comprising an electrically insulative substrate that defines a connector tab with first second and third electrical contacts positioned directly on the substrate at the connector tab, a single data bus connected to the first electrical contact, a ground bus electrically connected to the second electrical contact, and a power bus electrically connected to the third electrical contact and the adapter configured to electrically contact connectors of a second different prototyping format that defines multiple data connectors, the adapter being physically configured to electrically connect the single data bus of the first prototyping format to only one of the multiple data connectors of the second prototyping format, the adapter being configured to electrically connect the ground bus of the first prototyping format to a ground connector of the second prototyping format and to electrically connect the power bus of the first prototyping format to a power connector of the second prototyping format and is further configured to allow a user to define a direction of power flow between the power bus and the power connector.

Another example can include any of the above and/or below examples where the connector tab comprises multiple connector tabs each having first second and third contacts.

Another example can include any of the above and/or below examples where the data bus is connected to the first electrical contact of each of the multiple connector tabs, the ground bus is electrically connected to the second electrical contact of each of the multiple connector tabs, and the power bus is electrically connected to the third electrical contact of each of the multiple connector tabs.

Another example can include any of the above and/or below examples where the adapter comprises a user-actionable power switch to allow the user to select the direction of power flow.

Another example can include any of the above and/or below examples where the connectors of a second different prototyping format comprise pins.

Another example can include any of the above and/or below examples where the connectors of a second different prototyping format are positioned on an edge connector.

Another example can include any of the above and/or below examples where the adapter further comprises a receptacle configured to physically receive a device that complies with the second different prototyping format that defines multiple data connectors.

Another example can include any of the above and/or below examples where the receptacle further includes contacts that are configured to electrically couple with the multiple data connectors when the device is in the receptacle.

Another example includes a device comprising an electrically insulative substrate, at least two connector tabs defined by the substrate, each connector tab comprising a data contact a power contact and a ground contact positioned on the substrate, a data bus positioned relative to the substrate and electrically connecting all of the data contacts, a power bus positioned relative to the substrate and electrically connecting all of the power contacts, and a ground bus positioned relative to the substrate and electrically connecting all of the ground contacts in accordance with a first prototyping format, adapter contacts positioned on the substrate and configured to electrically connect to a data contact, a power contact, and a ground contact of another device that complies with a second different prototyping format and a switch to define a direction of power flow between the power bus and the power contact of the another device.

Another example can include any of the above and/or below examples where the adapter contacts are positioned in a receptacle.

Another example can include any of the above and/or below examples where the adapter contacts are configured to contact an edge connector of the another device while allowing the edge connector to be utilized to simultaneously connect to a further device of the second different prototyping format.

The invention claimed is:

1. A system, comprising:
an adapter device having at least one connector tab that comprises a data electrical contact connected to a single data bus, a ground electrical contact electrically connected to a single ground bus, and a power electrical contact connected to a single power bus according to a first prototyping format; and,
a set of electrical contacts arranged to electrically contact a connector of a second different prototyping format having multiple data lines, the adapter being physically configured to electrically connect the single data bus of the first prototyping format to only one of the multiple data lines of the second different prototyping format, the ground electrical contact of the first prototyping format to a ground line of the second different prototyping format.

2. The system of claim 1, wherein the adapter device is further configured to electrically connect the power electrical contact of the first prototyping format to a power conductor of the second different prototyping format.

3. The system of claim 2, wherein the adapter device is further configured to electrically connect the power electrical contact of the first prototyping format to a power electrical contact of the connector that is electrically connected to the power conductor of the second different prototyping format.

4. The system of claim 3, wherein the connector is part of a processor board that complies with the second different prototyping format.

5. The system of claim 4, wherein the adapter device further comprises a power control switch that is configured to selectively control whether power flows from the adapter device to the processor board or from the processor board to the adapter device.

6. The system of claim 1, wherein the first prototyping format specifies that all data electrical contacts are electrically coupled to the single data bus, all ground electrical contacts are electrically coupled to the single ground bus and all power electrical contacts are electrically coupled to the single power bus.

7. The system of claim 6, wherein the second different prototyping format specifies multiple distinct data conductors that are electrically insulated from one another.

8. The system of claim 1, wherein the adapter device comprises an electrically insulative substrate that defines the connector tab, and wherein the electrical contacts of the first prototyping format are positioned directly on a surface of the electrically insulative substrate at the connector tab.

9. The system of claim 1, wherein the connector is an edge connector.

10. The system of claim 9, wherein the adapter is physically configured to electrically connect the single data bus of the first prototyping format to only one of the multiple data lines of the second different prototyping format, the ground electrical contact of the first prototyping format to the ground line of the second different prototyping format, the power electrical contact of the first prototyping format to a power line of the second different prototyping format without blocking the edge connector of the second different prototyping format from being coupled to an accessory of the second different prototyping format.

11. A device, comprising:
an adapter device comprising an electrically insulative substrate that defines a connector tab with first second and third electrical contacts positioned directly on the substrate at the connector tab, a single data bus connected to the first electrical contact, a ground bus electrically connected to the second electrical contact, and a power bus electrically connected to the third electrical contact; and,
the adapter configured to electrically contact connectors of a second different prototyping format that defines multiple data connectors, the adapter being physically configured to electrically connect the single data bus of the first prototyping format to only one of the multiple data connectors of the second prototyping format, the adapter being configured to electrically connect the ground bus of the first prototyping format to a ground connector of the second prototyping format and to electrically connect the power bus of the first prototyping format to a power connector of the second prototyping format and is further configured to allow a user to define a direction of power flow between the power bus and the power connector.

12. The device of claim 11, wherein the connector tab comprises multiple connector tabs each having first second and third contacts.

13. The device of claim 12, wherein the data bus is connected to the first electrical contact of each of the multiple connector tabs, the ground bus is electrically connected to the second electrical contact of each of the multiple connector tabs, and the power bus is electrically connected to the third electrical contact of each of the multiple connector tabs.

14. The device of claim 11, wherein the adapter comprises a user-actionable power switch to allow the user to select the direction of power flow.

15. The device of claim 11, wherein the connectors of a second different prototyping format comprise pins.

16. The device of claim 11, wherein the connectors of a second different prototyping format are positioned on an edge connector.

17. The device of claim 11, wherein the adapter further comprises a receptacle configured to physically receive a device that complies with the second different prototyping format that defines multiple data connectors.

18. The device of claim 17, wherein the receptacle further includes electrical contacts that are configured to electrically couple with the multiple data connectors when the device is in the receptacle.

19. A device, comprising:
an electrically insulative substrate;
at least two connector tabs defined by the substrate, each connector tab comprising a data contact, a power contact and a ground contact positioned on the substrate;
a data bus positioned relative to the substrate and electrically connecting all of the data contacts, a power bus positioned relative to the substrate and electrically connecting all of the power contacts, and a ground bus positioned relative to the substrate and electrically connecting all of the ground contacts in accordance with a first prototyping format;
adapter contacts positioned on the substrate and configured to electrically connect to a data contact, a power contact, and a ground contact of another device that complies with a second different prototyping format; and, a switch configured to define a direction of power flow between the power bus and the power contact of the another device.

20. The device of claim 19, wherein the adapter contacts are positioned in a receptacle.

\* \* \* \* \*